US009979284B2

(12) United States Patent
Jung et al.

(10) Patent No.: US 9,979,284 B2
(45) Date of Patent: May 22, 2018

(54) SELF-OSCILLATING SWITCHED-CAPACITOR DC-DC CONVERTER

(71) Applicant: THE REGENTS OF THE UNIVERSITY OF MICHIGAN, Ann Arbor, MI (US)

(72) Inventors: Wanyeong Jung, Ann Arbor, MI (US); Sechang Oh, Ann Arbor, MI (US); Suyoung Bang, Ann Arbor, MI (US); Yoonmyung Lee, Ann Arbor, MI (US); Dennis Sylvester, Ann Arbor, MI (US); David T. Blaauw, Ann Arbor, MI (US)

(73) Assignee: The Regents of The University of Michigan, Ann Arbor, MI (US)

(*) Notice: Subject to any disclaimer, the term of this patent is extended or adjusted under 35 U.S.C. 154(b) by 0 days. days.

(21) Appl. No.: 15/116,072

(22) PCT Filed: Feb. 5, 2015

(86) PCT No.: PCT/US2015/014587
§ 371 (c)(1),
(2) Date: Aug. 3, 2016

(87) PCT Pub. No.: WO2015/120131
PCT Pub. Date: Aug. 13, 2015

(65) Prior Publication Data
US 2017/0170722 A1    Jun. 15, 2017

Related U.S. Application Data

(60) Provisional application No. 61/935,978, filed on Feb. 5, 2014.

(51) Int. Cl.
*H02M 3/07* (2006.01)
*H02M 1/36* (2007.01)
(Continued)

(52) U.S. Cl.
CPC ............. *H02M 3/07* (2013.01); *H02M 1/36* (2013.01); *H03K 3/0315* (2013.01); *H03K 19/017509* (2013.01)

(58) Field of Classification Search
CPC .. G05F 3/00; G05F 3/205; G11C 5/00; G11C 5/145; H02M 1/00; H02M 1/36;
(Continued)

(56) References Cited

U.S. PATENT DOCUMENTS

| 8,095,104 B2 | 1/2012 | Kawae et al. |
| 2009/0316445 A1 | 12/2009 | Mowrer et al. |
| 2012/0169319 A1* | 7/2012 | Dennard ............... H03K 3/00 323/364 |

FOREIGN PATENT DOCUMENTS

| JP | 05297077 B2 | 9/2013 |
| KR | 102008006623 A | 7/2008 |
| WO | WO-2012156952 A1 | 11/2012 |

OTHER PUBLICATIONS

International Search Report and Written Opinion for PCT/US2015/014587, dated May 21, 2015; ISA/KR.
(Continued)

*Primary Examiner* — Lincoln Donovan
*Assistant Examiner* — David Mattison
(74) *Attorney, Agent, or Firm* — Harness, Dickey & Pierce, P.L.C.

(57) ABSTRACT

A self-oscillating DC-DC converter structure is proposed in which an oscillator is completely internalized within the switched-capacitor network. This eliminates power overhead of clock generation and level shifting and enables higher efficiency at lower power levels. Voltage doublers are cascaded to form a complete energy harvester with a wide load range from 5 nW to 5 μW and self-starting operation down to 140 mV. Because each doubler is self-oscillating,
(Continued)

the frequency of each stage can be independently modulated, thereby optimizing the overall conversion efficiency.

21 Claims, 16 Drawing Sheets

(51) Int. Cl.
  *H03K 3/03* (2006.01)
  *H03K 19/0175* (2006.01)
(58) Field of Classification Search
  CPC ....... H02M 2003/00; H02M 2003/077; H02M 3/00; H02M 3/07; H02M 3/073; H03K 19/00; H03K 19/017509; H03K 3/0315
  USPC ........................................................ 327/536
  See application file for complete search history.

(56) References Cited

OTHER PUBLICATIONS

Texas Instruments "Ultra-Low Power Boost Converter With Battery Management for Energy Harvester Applications" bq25504 Slusahoc (2011).

Jong-Pil Im et al "A 40mV Transformer-Reuse Self-Startup Boost Converter with MPPT Control for Thermoelectric Energy Harvesting" 2012 IEEE International Solid-Sate Circuits Conference (2012).

Kin Wai Roy Chew et al "A 400nW Single-inductor Dual-Input-Tri-Output DC-Dc Buck-Boost Converter with Maximum Power Point Tracking for Indoor Photovoltaic Energy Harvesting", 2013 IEEE International Solid-State Circuits Conference (2013).

D. Somasekhar, et al "Multi-Phase 1 GHz Voltage Doubler Charge Pump in 32 nm Logic Process", IEEE Journal of Solid-State Circuits, vol. 45, No. 4 (Apr. 2010).

L. Chang et al "A Fully-Integrated Switched-Capacitor 2:1 Voltage Converter with Regulation Capability and 90% Efficiency at 2.3A/mm$^2$"" 2010 Symposium on VLSI Circuits/Technical Digest of Technical Papers (2010).

Po-Hung Chen et al "A 120-mV Input, Fully Integrated Dual-Mode Charge Pump in 65-nm CMOS for Thermoelectric Energy Harvester" Proc. ASP-DAC, pp. 469-470 (Jan. 2012).

I. Doms et al "Integrated Capacitive Power-Management Circuit for Thermal Harvesters with Output Power 10 to 1000µw", ISSCC Dig. Tech. Papers, pp. 300-301, (Feb. 2009).

K.Kadirvel et al "A 330nA Energy-Harvesting Charger with Battery Management for Solar and Thermoelectric Energy Harvesting", ISSCC Dig. Tech. Papers, pp. 106-108, (Feb. 2012).

\* cited by examiner

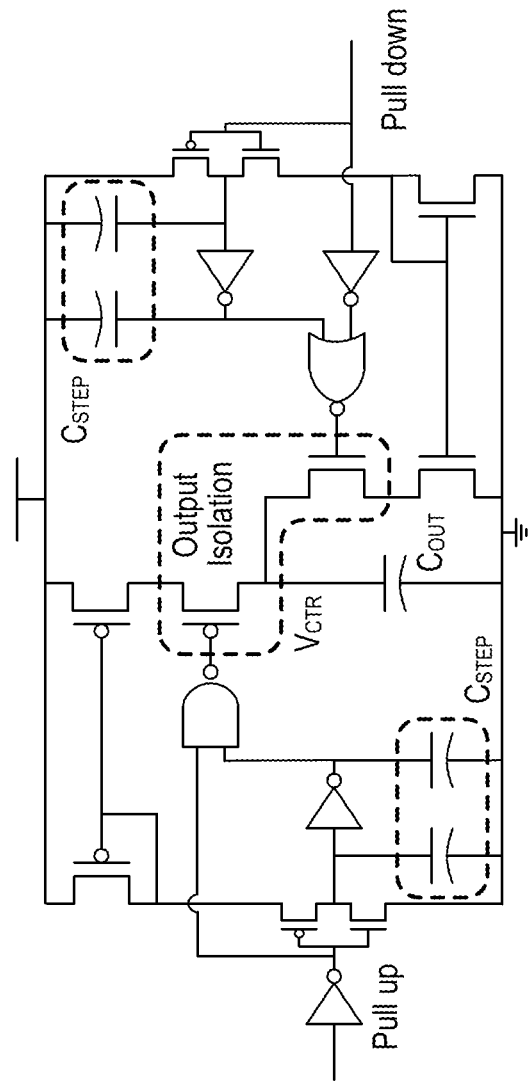
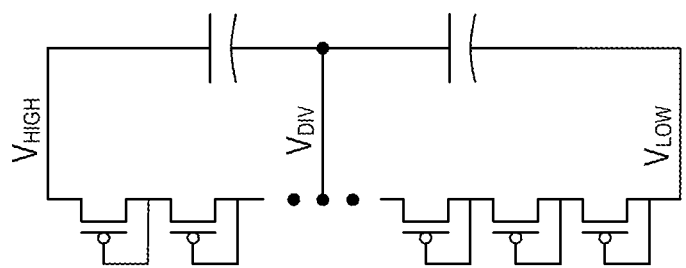
FIG. 11B
FIG. 11A

SELF-OSCILLATING SWITCHED-CAPACITOR DC-DC CONVERTER

CROSS-REFERENCE TO RELATED APPLICATIONS

This application is a U.S. National Phase Application under 35 U.S.C. 371 of International Application No. PCT/US2015/014587 filed Feb. 5, 2015 and published as WO 2015/120131 A1 on Aug. 13, 2015. This application claims the benefit of U.S. Provisional Application No. 61/935,978, filed on Feb. 5, 2014. The entire disclosures of the above applications are incorporated herein by reference.

GOVERNMENT CLAUSE

This invention was made with government support under CNS0910851 awarded by the National Science Foundation. The Government has certain rights in the invention.

FIELD

The present disclosure relates to a self-oscillating switched-capacitor DC-DC converter.

BACKGROUND

Recent advances in low power circuits have enabled mm-scale wireless systems for wireless sensor networks and implantable devices, among other applications. Energy harvesting is an attractive way to power such systems due to the limited energy capacity of batteries at these form factors. However, the same size limitation restricts the amount of harvested power, which can be as low as tens of nW for mm-scale photovoltaic cells in indoor conditions. Efficient DC-DC up-conversion at such low power levels (for battery charging) is extremely challenging and has not yet been demonstrated.

Boost DC-DC converters are widely used to harvest energy from DC sources and yield high conversion efficiency. However, they require a large off-chip inductor at low harvested power levels, increasing system size. Alternatively, switched-capacitor (SC) DC-DC converters can be fully integrated on-chip and are favored for form-factor constrained applications. At low power levels, SC converter efficiency is constrained by the overheads of clock generation and level-conversion to drive the switches. As a result, efficient SC converter operation has been limited to the μW range.

This disclosure presents a fully integrated switched-capacitor energy harvester that consists of cascaded self-oscillating voltage doublers. In each voltage doubler, an oscillator is completely internalized and clocking power overhead is reduced. The reduced power overhead of both clock generation and level shifting enables the harvester to operate with very weak power sources, as low as a few nWs. By completely integrating the clock generation in the SC, the overhead scales with the current load resulting in a very wide load range of ~1000×. By adjusting the number of cascaded voltage doublers as well as with a new method of modulating the low voltage applied to each doubler stage, the overall conversion ratio can be configured between 9× and 23×.

This section provides background information related to the present disclosure which is not necessarily prior art.

SUMMARY

This section provides a general summary of the disclosure, and is not a comprehensive disclosure of its full scope or all of its features.

A self-oscillating DC-DC converter is provided. The converter includes: an upper ring oscillator comprised of n upper stages and a lower ring oscillator comprised of n lower stages, where n is an odd integer greater than 2. Each upper stage having an input node, an output node, a supply node, and a return node, where the supply nodes from each upper stage are electrically coupled together and the return nodes from each upper stage are electrically coupled together. Each lower stage also has an input node, an output node, a supply node, and a return node, where the supply nodes from each lower stage are electrically coupled together and the return node from each lower stage are electrically coupled together. In addition, each return node in the upper oscillator is electrically coupled to a supply node in a corresponding stage in the lower oscillator. At least one capacitor is electrically coupled between an output node of the upper oscillator and an output node in a corresponding stage of the lower oscillator. It is envisioned that the DC-DC converter may have a three terminal or four terminal arrangement.

In one embodiment, each stage is implemented by an inverter circuit such as a static CMOS inverter. In other embodiments, each stage is implemented by a NAND gate.

To upconvert an input voltage, the DC-DC converter may be configured such that the supply nodes from the lower ring oscillator are coupled to one input terminal for the lower ring oscillator and the return nodes from the lower ring oscillator are coupled to another input terminal for the lower ring oscillator such that the pair of input terminals are configured to receive an input voltage for driving the lower ring oscillator; and the supply nodes from the upper ring oscillator are coupled to one output terminal for the upper ring oscillator and the return nodes from the lower ring oscillator are coupled to another output terminal for the upper ring oscillator such that the input voltage is upconverted to an output voltage measured across the pair of output terminals.

To downconvert an input voltage, the DC-DC converter may be configured such that the supply nodes from the upper ring oscillator are coupled to one input terminal for the upper ring oscillator and the return node from the lower ring oscillator are coupled to another input terminal for the upper ring oscillator such that the pair of input terminals are configured to receive an input voltage; and the supply nodes from the lower ring oscillator are coupled to one output terminal for the lower ring oscillator and the return nodes from the lower ring oscillator are coupled to another output terminal for the lower ring oscillator such the input voltage is downconverted to an output voltage measured across the pair of output terminals.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 11A and 11B are schematics of an example voltage divider circuit and charge pump circuit, respectively, from FIG. 8;

Corresponding reference numerals indicate corresponding parts throughout the several views of the drawings.

DETAILED DESCRIPTION

Example embodiments will now be described more fully with reference to the accompanying drawings.

Figure 1:
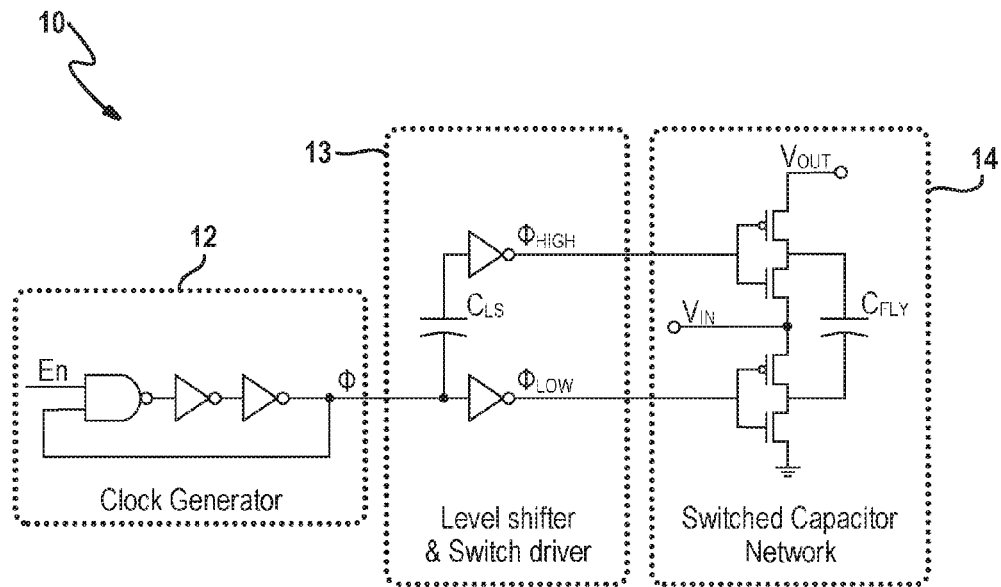
FIG. 1 is a schematic of a conventional capacitive voltage doubler.

With reference to FIG. 1, conventional SC DC-DC voltage doublers 10 generally consist of three parts: clock generator 12, level shifter 13 and switched capacitor network (SCN) 14. The clock generator 12 produces a clock, which is fed into the level shifters 13. The level shifters 13 take the clock and create switch control signals for the SCN. As the clock oscillates, the SCN 14 periodically changes its connections to generate the output voltage. Each of these blocks introduces power overhead, reducing efficiency. Looking at each transistor in the complete converter circuit, the dynamic power consumption of SCN switches directly contributes to generating output power, whereas the clock generator 12 and level shifter 13 power consumption: does not contribute to output power. As a result, the basic motivation of the proposed self-oscillating voltage doubler is to remove the unnecessary power consumption of those secondary blocks and transistors.

Figure 2:
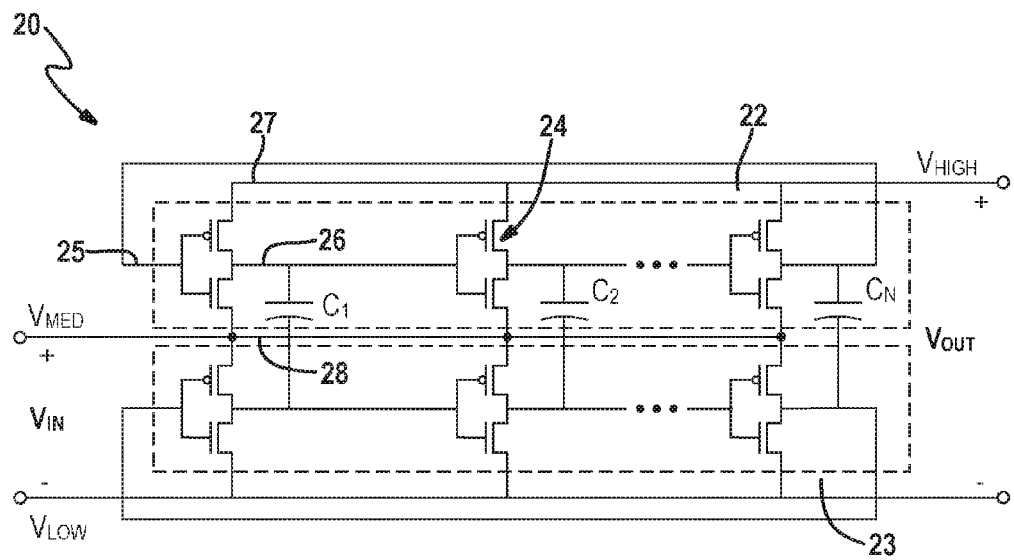
FIG. 2 is a schematic of an example embodiment of the proposed self-oscillating DC-DC converter.

FIG. 2 illustrates the basic structure of an example embodiment of a self-oscillating voltage doubler 20. The voltage doubled 20 includes an upper ring oscillator 22 comprised of three upper stages and a lower ring oscillator 23 comprised of three lower stages. In the example embodiment, each stage is implemented by an inverter circuit 24 which defines an input node 25, an output node 26, a supply node 27 and a return node 28 for each stage. In the upper ring oscillator 22, the supply nodes 27 are electrically coupled together and the return nodes 28 are electrically coupled together. Likewise, in the lower ring oscillator 23, the supply nodes 27 are electrically coupled together and the return nodes 28 are electrically coupled together. Each return node in the upper ring oscillator 22 is also electrically coupled to a supply node in a corresponding stage in the lower ring oscillator 23.

Additionally, there are capacitors 29 electrically coupled between the upper ring oscillator 22 and the lower ring oscillator 23, such that one capacitor is electrically connected between each output node of the upper oscillator and an output node of the corresponding stage in the lower oscillator. In each stage, inverters 24 from the top and bottom ring oscillators 22, 23 either charge or discharge the flying cap, thereby transferring power to the upper ring oscillator 22.

Simultaneously, the inverters 24 drive the next stage in their ring, creating a multi-phase DC-DC converter with overlapping charge/discharge phases and self-sustaining operation. Every transistor in this structure is essentially a flying cap switch and hence dynamic power loss is minimized since there are no superfluous transistors. The natural multi-phase operation reduces output voltage ripple with little cost.

Another advantage of this structure lies in reduced level shifting overhead. Conventional level shifters generally use output keepers, which generate contention loss in addition to dynamic power loss. This contention loss comes from the timing mismatch among the signals of a level shifter; depending on the amount of mismatch, contention loss can dominate dynamic power consumption and greatly reduce overall efficiency. Some previous SC voltage converters have used non-overlapping clocks to reduce level shifting contention loss. However, this introduces another overhead, i.e., generation of the non-overlapping clocks. Additionally, such a converter does not actively convert power during the non-overlapping periods, reducing its maximum output power.

The self-oscillating voltage doubler 20 has no dedicated level shifter because both ring oscillators actively generate their own clock signals. However, contention loss can still arise from phase mismatch between the two oscillations. This is mitigated by the fact that the two oscillators are synchronized at every stage and hence the amount of mismatch is very small, avoiding the need for non-overlapping clocks. According to simulation results, phase mismatch is less than 1% of a fanout-of-4 (FO4) inverter delay, and contention loss from this mismatch is also under 1% of total dynamic power loss.

The self-oscillating voltage doubler 20 is capable of self-startup regardless of its initial state. When input voltage $V_{IN}$ is initially supplied to $V_{MED}$, the bottom oscillator starts oscillating. In each SCN stage of the doubler 20, both the nodes before and after the flying cap driver are coupled between the top and bottom oscillator. Therefore, even when $V_{HIGH}$ is very low and the top oscillator is not oscillating by itself, the coupled nodes in the top oscillator 22 will be rising and falling, and hence some charge is transferred to $V_{HIGH}$ solely due to the driving capability of the bottom oscillator 23. Due to this fluctuation of the top nodes, $V_{HIGH}$ can rise above the average voltage level of the top nodes. As $V_{HIGH}$ becomes higher, the average level of the top nodes also increases, forming a positive feedback that raises $V_{HIGH}$ above $V_{MED}$. As $V_{HIGH}$ rises higher than $V_{MED}$, the top oscillator 22 starts normal oscillation on its own. Because the top oscillator 22 is initially much weaker than the bottom, the top oscillation 22 is naturally synchronized to the bottom oscillator 23. After synchronization, the voltage doubler 20 starts normal operation, continually generating output power.

Figure 3:
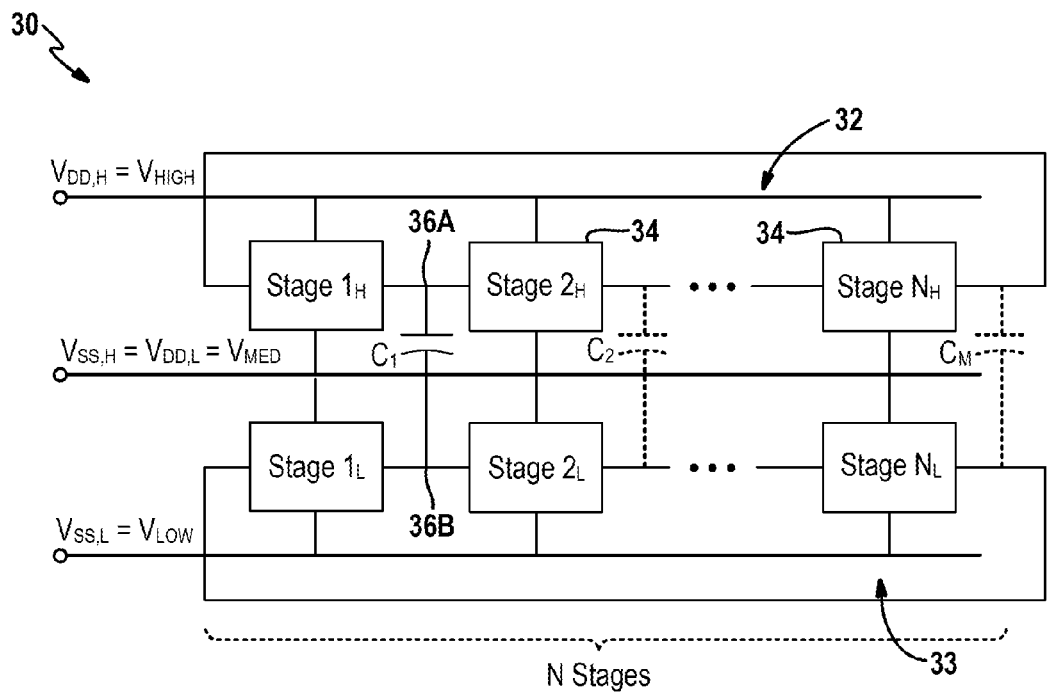
FIG. 3 is a diagram of a generalized embodiment of a self-oscillating DC-DC converter.
Figure 4A:
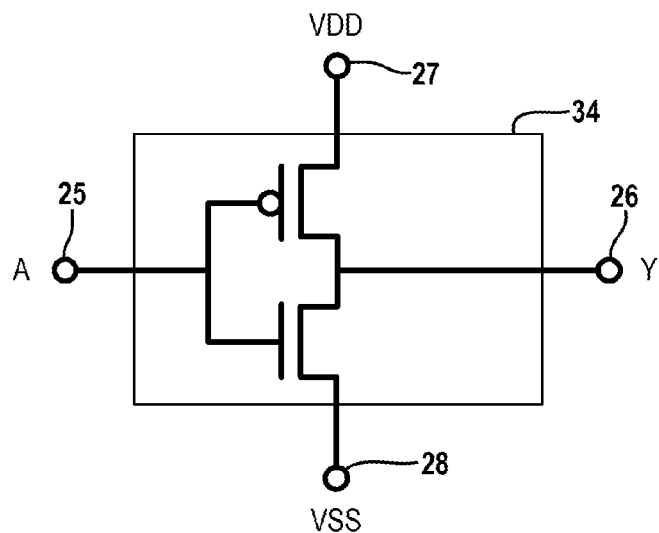
FIGS. 4A-4C are schematics for example circuit arrangements for stages of the DC-DC converter.
Figure 4B:
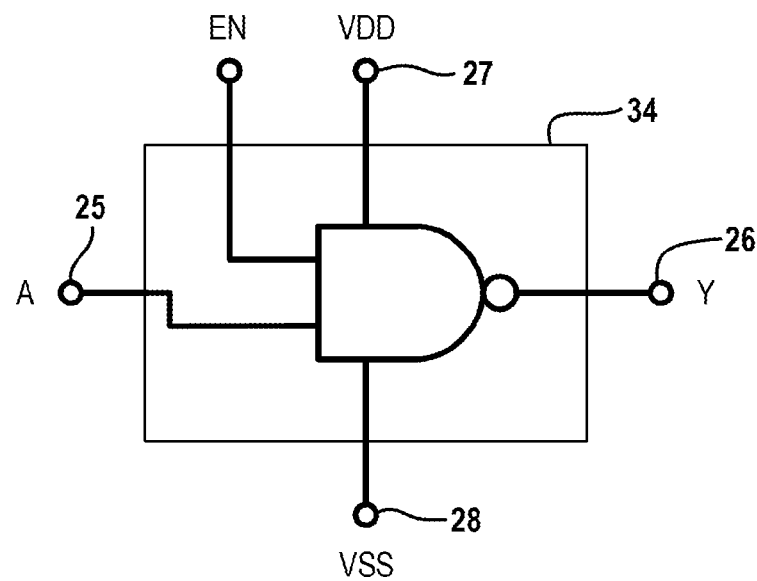
Figure 4C:
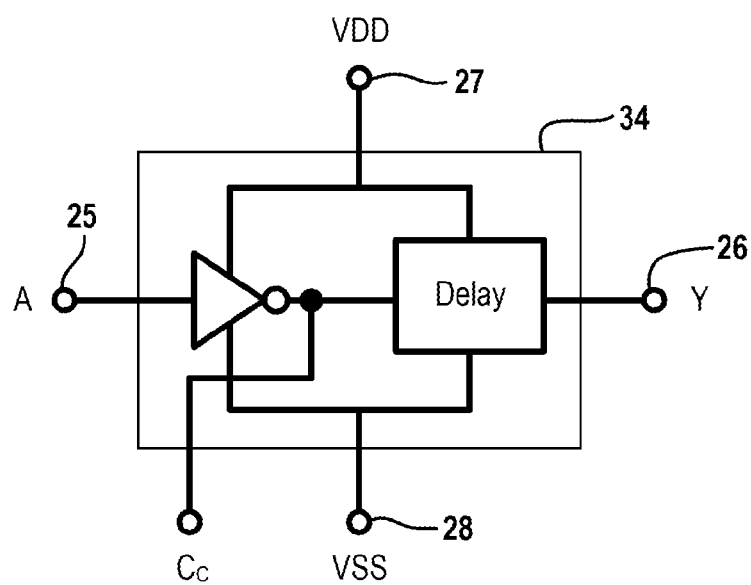

FIG. 3 illustrates a generalized embodiment of a self-oscillating DC-DC converter 30 having three terminals. The converter 30 is comprised of an upper ring oscillator 32 having n stages and a lower ring oscillator 33 having n stage, where n is an odd integer greater than two. Each stage 34 can be implemented by different circuit arrangements and thus is represented by a box. Example circuit arrangements for implementing each stage are shown in FIGS. 4A-4C. In FIG. 4A, a stage 34 is implemented by an inverter circuit, such as a static CMOS inverter. In FIG. 4B, a stage 34 is implemented by a NAND gate which is configured to perform an inverting function or equivalent circuitry. It is envisioned that a stage could be implemented using other type of logic gates, such as a NOR gate, XOR gate, etc., which are configured to perform an inverting function and the type of gates can differ amongst stages. In FIG. 4C, a stage 34 is implemented by an inverter followed by a delay cell. While particular circuit arrangements are provided as examples, it is readily understood that the stages of the oscillators could be implemented using other types of circuits as well.

At least one capacitor is electrically coupled between the upper ring oscillator 32 and the lower ring oscillator 33. In this example, a capacitor C1 is shown coupled between output node 36A of the first stage in the upper ring oscillator 32 and output node 36B of the first stage in the lower ring oscillator 33. As shown, it is envisioned that the number of capacitors can vary between one and n, where n is the number of stages.

To drive the DC-DC converter 30, the supply nodes from the upper ring oscillator 32 are coupled to a terminal 37 configured to receive a first input voltage $V_{High}$, the return nodes from the upper ring oscillator 32 and the supply nodes from the lower ring oscillator 33 share a terminal configured to receive a second input voltage $V_{Med}$, and the return nodes from the lower ring oscillator 33 are coupled to a terminal configured to receive a third input voltage $V_{Low}$, where the second input voltage is larger than the third input voltage and the first input voltage is larger than the second input voltage. Operation of this self-oscillating DC-DC converter 30 is otherwise as described above in relation to FIG. 2.

Figure 5A:
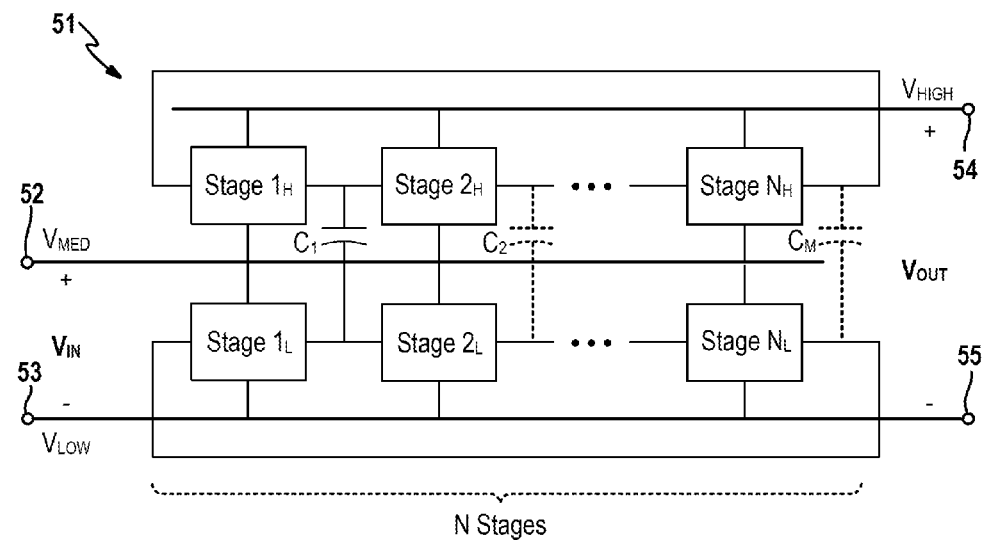
FIGS. 5A-5C are schematics of different arrangements of the DC-DC converter for performing different functions.
Figure 5B:
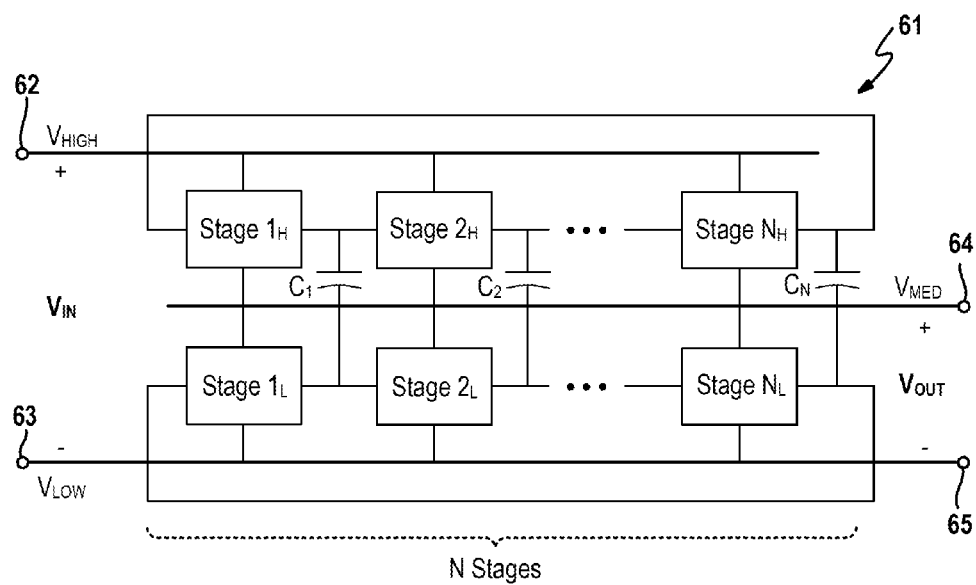
Figure 5C:
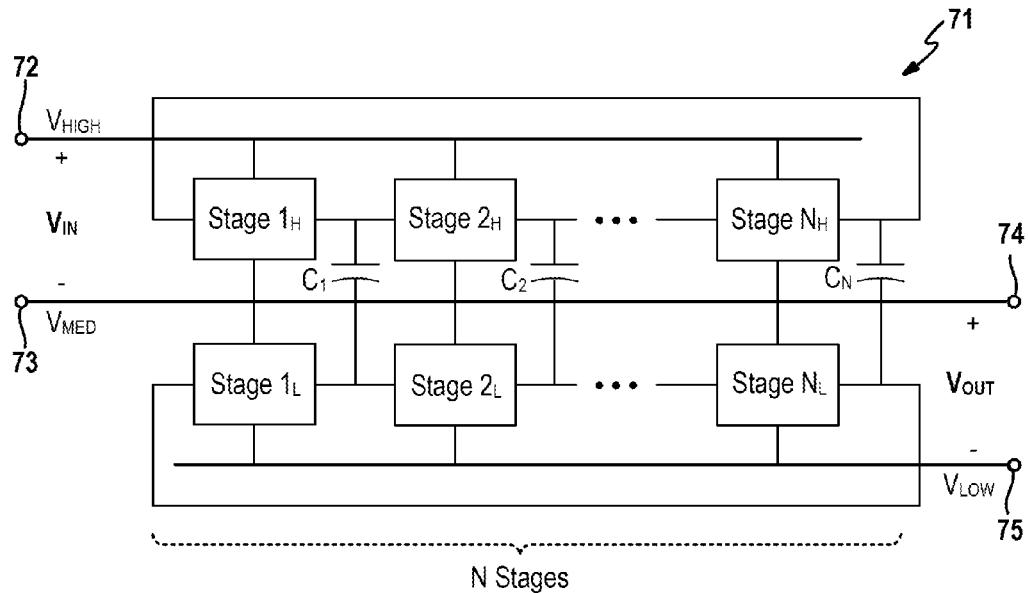

The circuit arrangement for the DC-DC converter 30 can be configured for different functions as described in relation to FIGS. 5A-5C. In FIG. 5A, the DC-DC converter 51 is configured to upconvert an input voltage $V_{In}$. In this arrangement, the supply nodes from the lower ring oscillator are coupled to one input terminal 52 and the return nodes from the lower ring oscillator are coupled to another input terminal 53 such that the pair of input terminals are configured to receive an input voltage for driving the lower ring oscillator. The supply nodes from the upper ring oscillator are coupled to one output terminal 54 for the upper ring oscillator and the return nodes from the lower ring oscillator are coupled to another output terminal 55 for the upper ring oscillator such that the input voltage $V_{In}$ is upconverted to an output voltage $V_{Out}$ which is double the magnitude of the input voltage.

In FIG. 5B, the DC-DC converter 61 is configured to downconvert an input voltage $V_{in}$. In this arrangement, the supply nodes from the upper ring oscillator are coupled to one input terminal 62 and the return node from the lower ring oscillator are coupled to another input terminal 63 such that the pair of input terminals are configured to receive an input voltage. The supply nodes from the lower ring oscillator are coupled to one output terminal 64 and the return nodes from the lower ring oscillator are coupled to another output terminal 65 such the input voltage $V_{in}$ is downconverted to an output voltage $V_{Out}$ which is half the magnitude of the input voltage.

In FIG. 5C, the DC-DC converter 71 is configured to flip the sign of the input voltage $V_{in}$. In this arrangement, the supply nodes from the upper ring oscillator are coupled to one input terminal 72 and the return nodes from the upper ring oscillator are coupled to another input terminal 73 such that the pair of input terminals are configured to receive an input voltage $V_{In}$ for driving the upper ring oscillator. The supply nodes from the lower ring oscillator are coupled to one output terminal 74 and the return nodes from the lower ring oscillator are coupled to another output terminal 75 such the output voltage $V_{Out}$ has an inverted polarity from the input voltage.

Figure 6:
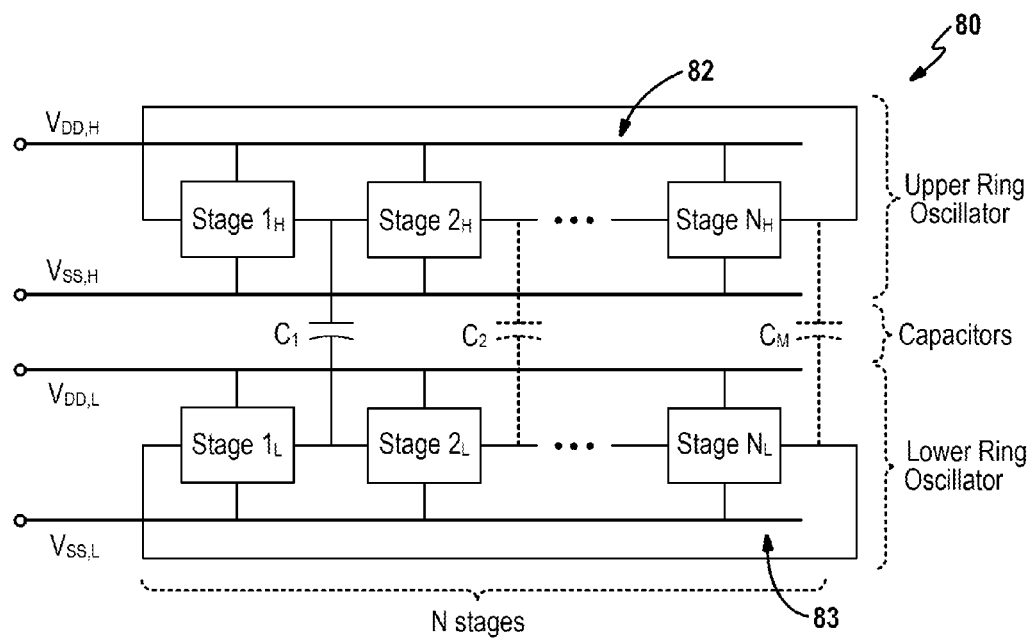
FIG. 6 is a diagram of a generalized embodiment of a self-oscillating DC-DC converter with four terminals.

FIG. 6 illustrates another generalized embodiment of a self-oscillating DC-DC converter 80 having four terminals. The converter 30 is comprised of an upper ring oscillator 82 having n stages and a lower ring oscillator 83 having n stage, where n is an odd integer greater than two. In this arrangement, the return nodes for the upper ring oscillator are separated from the supply nodes for the lower ring oscillator; otherwise, this arrangement operates in a manner similar to the self-oscillating DC-DC converter 30 described above.

The self-oscillating DC-DC converter 80 can also be configured for different functions, such as a summing operation to step up an input voltage. For example, when a one volt signal is applied to the lower ring oscillator (i.e. across terminals $V_{DD,L}$ and $V_{SS,L}$) and a three volt signal is applied to the terminal labeled $V_{SS,H}$, these two voltages are summed together such that a four volt output signal is measured at the terminal labeled $V_{DD,H}$. It is envisioned that four terminal circuit arrangement may be configured to perform other functions.

A modulation scheme for optimum conversion efficiency is further described in relation to the circuit arrangement of FIG. 2. The self-oscillating voltage doubler 20 is modulated to maintain optimum conversion efficiency over a wide range of output power levels. While reference is made to this particular arrangement, it is readily understood that the modulation principles described below can be extended to the other circuit arrangements set forth in this disclosure.

The specific goal of the modulation is to balance conduction and switching losses by examining the ratio of output to input voltages ($R_{DIV}=V_{OUT}/V_{IN}$). A low $R_{DIV}$ indicates a large voltage across the switches and dominant conduction loss. Conversely, high $R_{DIV}$ indicates low conduction loss (zero as $R_{DIV} \rightarrow 2$) and more dominant switching losses due to a higher frequency needed to transfer the same amount of load current.

To find optimum $R_{DIV}$, $C_{FLY}$ is defined as the total amount of flying cap, f as the oscillation frequency, and $\Delta$ as the amount of voltage drop:

$$\Delta = 2V_{IN} - V_{OUT} \tag{1}$$

The voltage doubler operates in a multi-phase manner with low ripple, and hence $V_{Out}$ is assumed to be constant in this analysis. In this case the input power to the voltage doubler PIN can be approximately written as $$P_{IN} = 2C_{FLY}V_{IN}\Delta f \tag{2}$$

by additionally assuming that $\Delta \ll V_{IN}$ and that the top and the bottom oscillators have similar total parasitic capacitances. With these additional assumptions, the active current going out from $V_{HIGH}$ to $V_{MED}$ through the top oscillator is nearly reused as the active current flowing from $V_{MED}$ into $V_{LOW}$ through the bottom oscillator. Therefore, only a small portion of the total parasitic effect, or switching loss, is actually incorporated into the true input power, hence the approximate equation is relatively accurate. Simulation results also support the existence of this current reuse and the $P_{IN}$ approximation. For example, in a simulation with $\Delta = 0.2\ V_{IN}$, true input power differs from $P_{IN}$ in (2) only less than 15% of the total switching loss.

Conduction loss $L_c$ comes from the effective internal resistances of the voltage converter. Assuming DC at the power rails, this loss is the same as the loss from charge sharing, and can be written as $$L_C = C_{FLY} \Delta^2 f \tag{3}$$

Switching loss $L_s$ is the total dynamic power loss in the voltage doubler:

$$L_s = (\Sigma_{non\text{-}flying} \alpha_i C_i V_{swing_i}^2) f = C_{EFF} V_{IN}^2 \tag{4}$$

where $C_i$ is every non-flying capacitor including parasitic capacitance, and $V_{SWING}$ and $\alpha_i$ are the voltage swing and activity factor of each non-flying capacitor, respectively. $C_{EFF}$ is defined as $$C_{EFF} = \sum_{non\text{-}flying} \alpha_i C_i \frac{V_{SWING_i}^2}{V_{IN}^2} \cong \sum_{non\text{-}flying} C_i \tag{5}$$

and is independent of the oscillation frequency. This value depends on $\Delta$ because the $V_{SWING}$ of the top oscillator nodes depend on $\Delta$, however it is fairly constant with $\Delta \ll V_{IN}$.

The ratio of these losses to input power can then be written as $$\frac{L_C}{P_{IN}} = \frac{C_{FLY} \Delta^2 f}{2 C_{FLY} V_{IN} \Delta f} = \frac{\Delta}{2 V_{IN}} \tag{6}$$

and $$\frac{L_S}{P_{IN}} = \frac{C_{EFF} V_{IN}^2 f}{2 C_{FLY} V_{IN} \Delta f} = \frac{C_{EFF} V_{IN}}{2 C_{FLY} \Delta} \tag{7}$$

Figure 7:
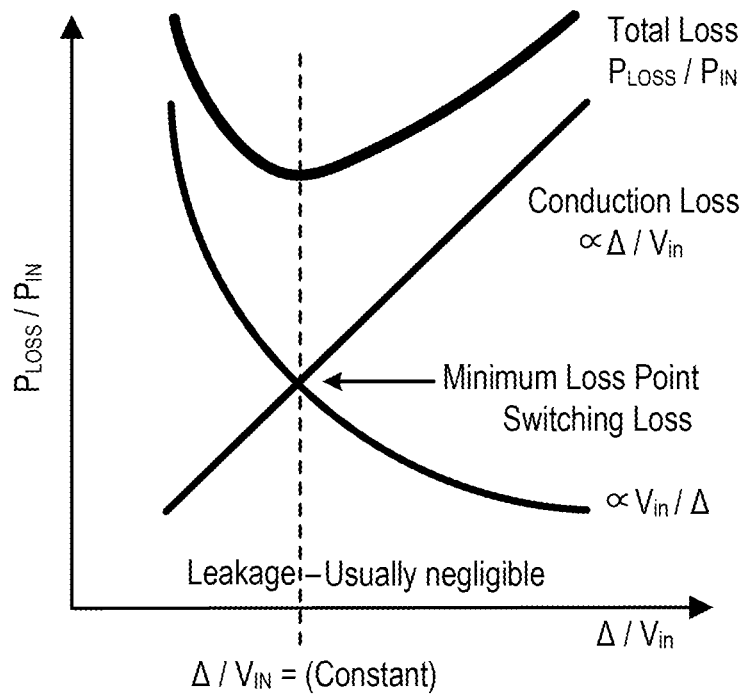
FIG. 7 is a graph showing rough dependency of voltage doubler loss elements on Δ.
Figure 8:
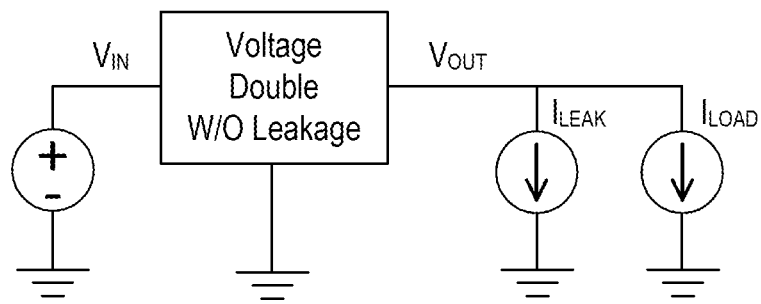
FIG. 8 is a diagram of a leakage loss model of the voltage doubler.

These two ratios are clear functions of $\Delta$. Assuming $\Delta \ll V_{IN}$ and neglecting the weaker dependency of $C_{EFF}$ on $\Delta$, the inequality of arithmetic and geometric means $$\frac{x+y}{2} \geq \sqrt{xy} \tag{8}$$

can be applied as illustrated in FIG. 7, to obtain the lower bound of total loss ratio:

$$\frac{L_{TOTAL}}{P_{IN}} = \tag{9}$$

$$\frac{L_C + L_S}{P_{IN}} = \frac{\Delta}{2 V_{IN}} + \frac{C_{EFF} V_{IN}}{2 C_{FLY} \Delta} \geq \sqrt{\frac{\Delta}{V_{IN}} \times \frac{C_{EFF} V_{IN}}{C_{FLY} \Delta}} = \sqrt{\frac{C_{EFF}}{C_{FLY}}}$$

Therefore, maximum efficiency $\eta_{MAX}$ is $$\eta_{MAX} = 1 - \left(\frac{L_{TOTAL}}{P_{IN}}\right)_{MIN} = 1 - \sqrt{\frac{C_{EFF}}{C_{FLY}}} \tag{10}$$

when the following equality condition is satisfied:

$$\frac{\Delta}{2 V_{IN}} = \frac{C_{EFF} V_{IN}}{2 C_{FLY} \Delta} \tag{11}$$

put differently:

$$\frac{\Delta}{V_{IN}} = \sqrt{\frac{C_{EFF}}{C_{FLY}}} = \left(\frac{L_{TOTAL}}{P_{IN}}\right)_{MIN} \tag{12}$$

or $$R_{DIV} = \frac{V_{OUT}}{V_{IN}} = 2 - \frac{\Delta}{V_{IN}} = 2 - \sqrt{\frac{C_{EFF}}{C_{FLY}}} = 1 + \eta_{MAX} \tag{13}$$

Therefore, as long as the circuit operates properly and these two losses are dominant, its optimum efficiency is nearly a constant value that is determined by the ratio of total parasitic capacitances to the total flying capacitances $C_{FLY}$, and $R_{DIV}$ at optimum efficiency is also a constant.

As output power becomes smaller, leakage power loss becomes dominant over the conduction and switching losses. Leakage loss can be modeled as a constant current sink attached to the output node, as shown in FIG. 4. In simulation, amount of equivalent leakage current, $I_{LEAK}$, does not vary over 8% across a wide output voltage range ($V_{IN} < V_{OUT} < 2 \times V_{IN}$). In this model, overall conversion efficiency is $$\eta_{overall} = \eta_{without\text{-}leakage} \times \frac{I_{LOAD}}{I_{LOAD} + I_{LEAK}} \tag{14}$$

and is optimized with the same arguments as a voltage doubler with no leakage, if the load can be approximately considered as a constant current sink. Therefore, even when output power is very small, the optimum efficiency point is still at a similar condition to (13), namely:

$$R_{DIV} \cong 2 - \sqrt{\frac{C_{EFF}}{C_{FLY}}} \tag{15}$$

Figure 9:
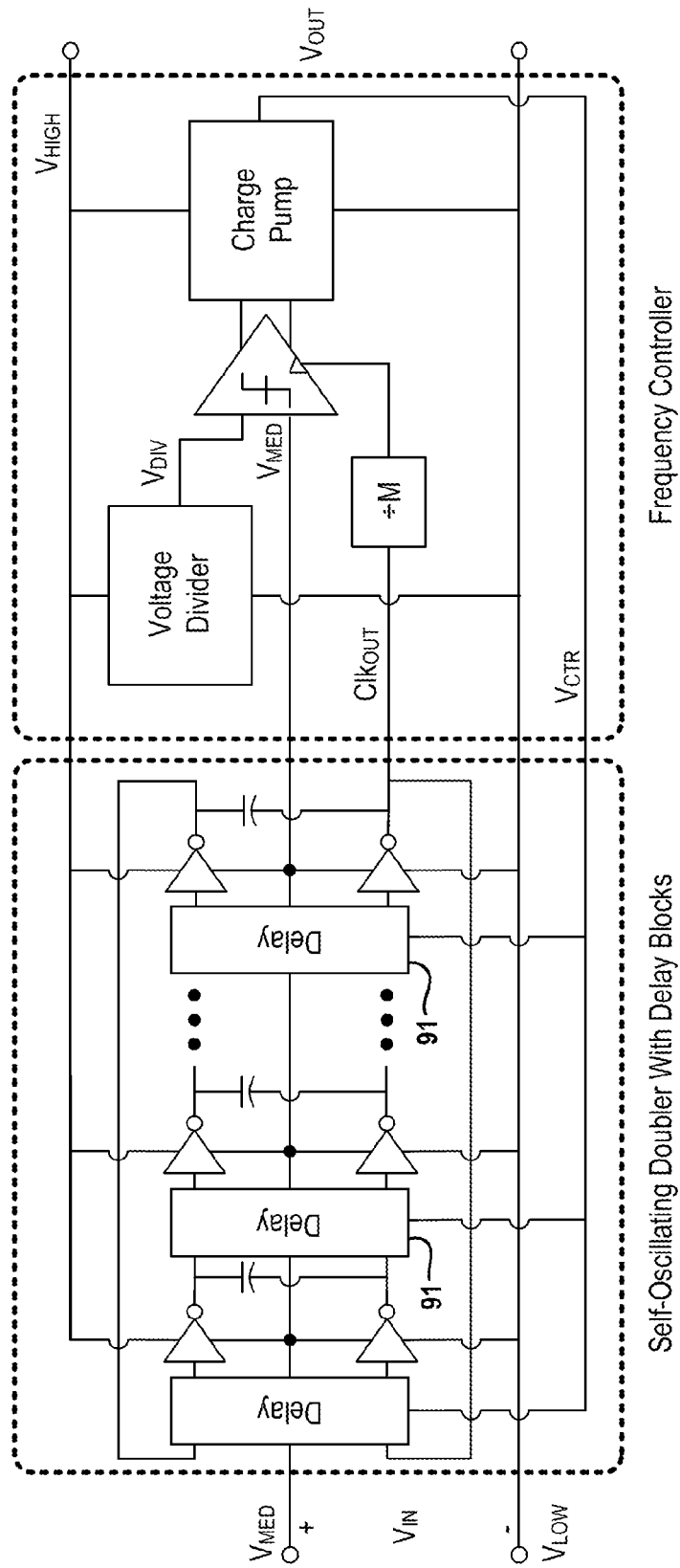
FIG. 9 is a schematic of an example implementation of the proposed voltage doubler with frequency modulation.

In this disclosure, voltage doubler oscillation frequency is modulated to achieve optimum $R_{DIV}$. Delay blocks are inserted in the oscillation paths and their delay is controlled by an analog delay tuning voltage, $V_{CTR}$ (FIG. 9). Negative feedback control of $V_{CTR}$ adjusts the output voltage level to the desired optimum level.

Instead of frequency modulation, a block enabling scheme is another candidate approach to use the proposed design in a high performance setting with higher power demands. In this scheme, several independent voltage doubler blocks that share the same input and output ports are prepared, with each block capable of being turned on/off independently. According to the desired output power level, the number of turned-on blocks are adjusted to keep optimum output to input voltage ratio. This scheme does not require any delay elements in the oscillation paths, eliminating efficiency loss from delay elements. To match time constants for charging/discharging flying caps to the oscillation period, the ring structure can be lengthened (i.e., more stages) to match its open-loop clock signal path effort to each stage effort for charging/discharging a flying capacitor. In this scheme, the coarser granularity control relative to frequency modulation reduces efficiency when output power is lower than the optimal output power of a unit voltage doubler block. The block enabling scheme also requires more transistors and flying capacitors, increasing area. To focus on the ultra-low power design space, this disclosure adopts the frequency modulation scheme.

Figure 10:
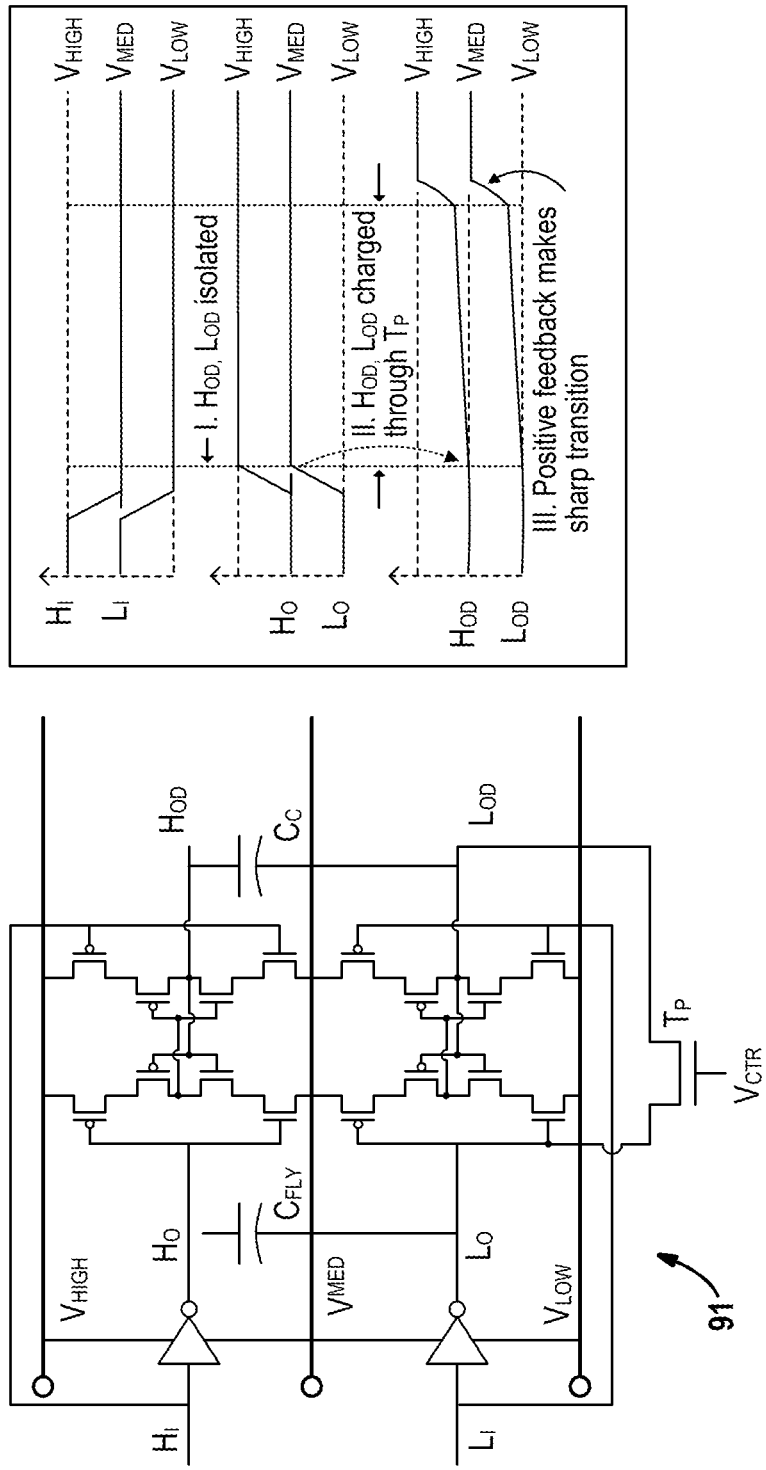
FIG. 10 shows a detailed implementation of a delay block and its timing diagram.

FIG. 9 shows the detailed implementation of the voltage doubler with frequency modulation. To modulate oscillation frequency, delay blocks 91 are inserted in the oscillation paths. As shown in FIG. 10, a delay block 91 consists of two coupled leakage based delay elements and a pass transistor TP controlled by $V_{CTR}$. When the inputs HI and LI of a stage switch from high to low, output nodes $H_{OD}$, and $L_{OD}$ (driven low) become isolated. TP then provides a leakage path from $L_O$ to $L_{OD}$ that slowly raises $L_{OD}$ and, through $C_C$, also $H_{OD}$. Back-to-back inverters in the delay element provide positive feedback and amplify the transition once it reaches $V_{TH}$, creating a sharp edge. This transition is then passed to the next stage. The opposite transition functions similarly.

A higher $V_{CTR}$ allows TP to provide more leakage, reducing the delay and speeding the oscillation. The leakage through TP can be adjusted to any amount between its on and off currents, offering a very wide range of delay controllability. Additionally, due to the output isolation, the structure can produce very long, synchronized delays while the coupled positive feedback creates a sharp edge that limits short-circuit current and contention loss, enabling ultra-low power operation with very slow oscillation speed.

This structure also has an advantage for low-power self-startup and idle power minimization. It can oscillate even when the control voltage is 0, though very slowly, and therefore, is capable of self-startup. When the input voltage become available from the cold stage, $V_{CTR}$ goes up from zero voltage, speeding up its oscillation until it reaches optimum. Start-up energy is reduced because its initial oscillation starts from the slowest speed, minimizing dynamic energy loss during start-up. When no input power is available from the power source, $V_{IN}$ always becomes lower than $V_{DIV}$, pulling down the control voltage $V_{CTR}$ to its lowest possible value. This automatically minimizes the idle power consumption.

$V_{CTR}$ is adjusted through negative feedback. A clocked comparator, operating at a fraction of the internal oscillator frequency, takes in a divided form of the output voltage ($V_{DIV}=V_{OUT}/R_{DIV\_DESIRED}$) and the input voltage $V_{IN}$. A charge pump then takes in the corresponding pull-up/pull-down signals and adjusts the delay tuning voltage $V_{CTR}$ as needed to either speed or slow the oscillation. As shown in FIG. 11A, the voltage divider is implemented with a combination of a diode stack and a capacitive divider, to provide both fast response and good low-frequency behavior. In the charge pump, two input inverter chains with small capacitive loads, $C_{STEP}$, determine the amount of charge transfer per cycle to be similar to $VDD \times C_{STEP}$ as seen in FIG. 11B. Each chain also generates a short pulse at an output isolation transistor, turning it on briefly and only while the mirrored current flows through. The isolation transistors are turned off otherwise and help sustain the output voltage more than 1000 times longer in simulation than without isolation, even when clock frequency is as low as a few Hz.

Figure 12:
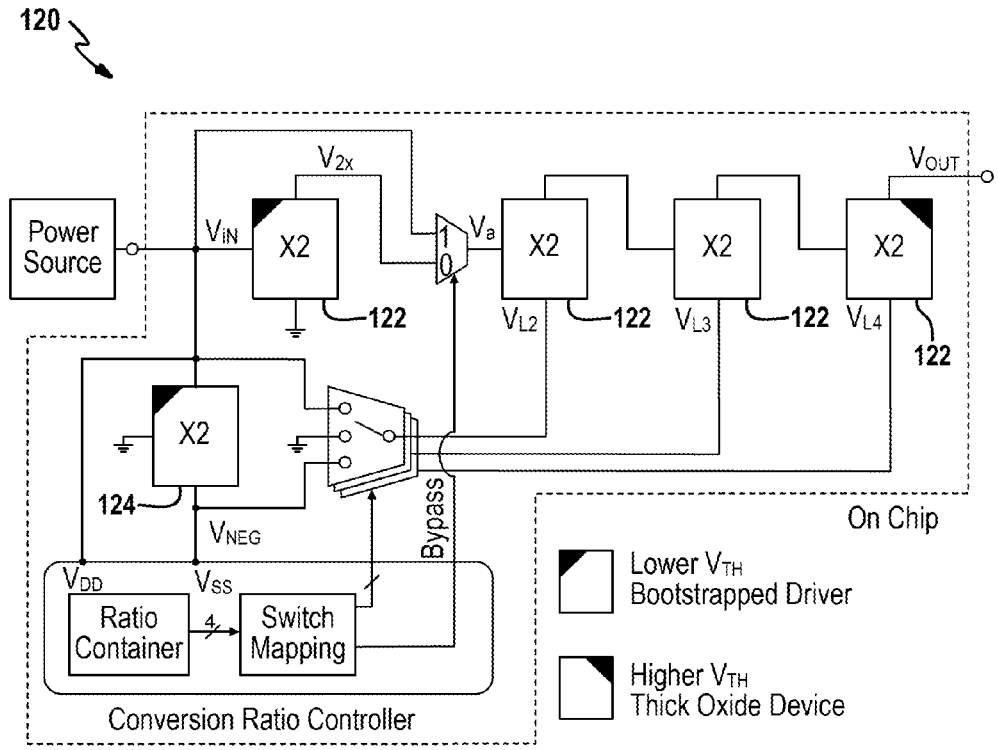
FIG. 12 is a diagram depicting an overall energy harvester architecture.

FIG. 12 is a block diagram for a complete harvesting system 120, consisting of four stages of cascaded voltage doublers 122, a negative voltage generator 124, and circuits for conversion ratio control. A negative voltage is used to boost overall conversion ratio over 16× and to power control circuits. The negative voltage generator 124 is implemented by connecting $V_{HIGH}$ and $V_{MED}$ of the doubler to $V_{IN}$ and ground, respectively, resulting in $V_{NEG} \approx -V_{IN}$ at the $V_{LOW}$ port of the doubler. The target $R_{DIV}$ of each voltage doubler is adjusted for its optimal operation.

Figure 13:
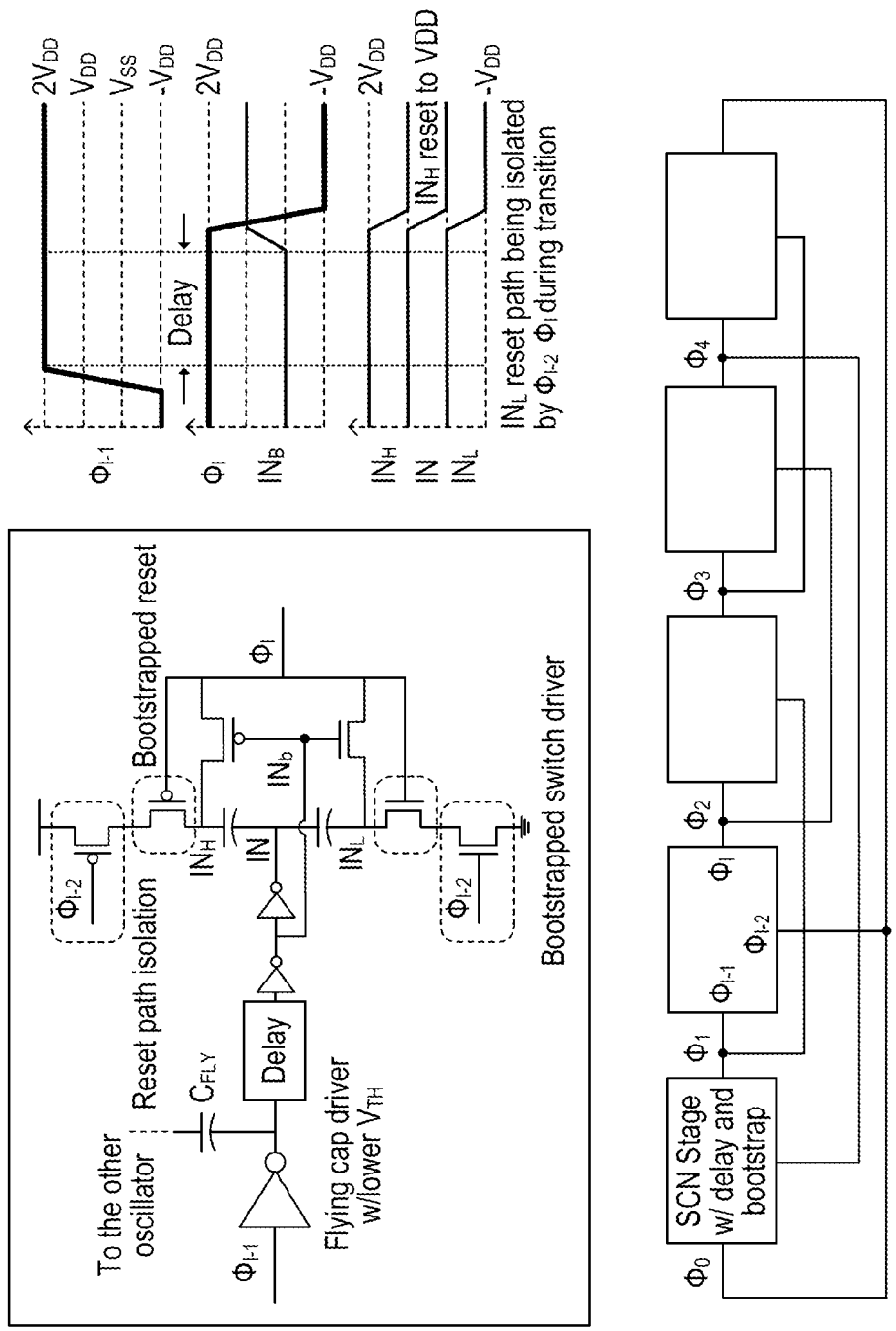
FIG. 13 is a diagram of an example five-stage bootstrapped ring oscillator for voltage doublers with lower voltage threshold switches and its timing diagram.

To facilitate energy harvesting from a low voltage source (e.g., a photovoltaic cell under low light), the first stage and negative voltage generator use low $V_{TH}$ (~300 mV) devices for their flying cap drivers. Bootstrapping is also used with these low $V_{TH}$ switches, as shown in FIG. 13, to improve $I_{ON}/I_{OFF}$ ratio at low input voltages. To ensure the bootstrapped signal does not decay in a clock cycle, every transistor in the bootstrap circuit uses a regular threshold voltage. For robust bootstrapping with a fast oscillation frequency, a reset switch for each bootstrap capacitor is driven by the output $\varphi_1$, which has an increased voltage swing. To eliminate the short-circuit path through the reset switches, an isolation transistor is inserted in each reset path, which is driven by $\varphi_{I-2}$, the output signal of one of the previous bootstrap stages. Thick oxide I/O devices are used in the final doubler stage to protect the circuit from high voltages used to charge energy storage devices such as batteries or supercapacitors.

The conversion ratio is adjusted by changing the number of cascaded stages. An additional adjustment scheme is proposed where the $V_{LOW}$ of a doubler is switched among $V_{IN}$, $G_{ND}$, and $V_{NEG}$, as shown in FIG. 12. If $V_{LOW}$ is set to $-V_{IN}$, the voltage across the flying cap increases, resulting in $V_{OUT}=(V_{MED}+V_{IN}) \times 2-V_{IN}=2 \times V_{MED}+V_{IN}$. If $V_{LOW}$ is set to ground for all 4 cascaded stages, the overall conversion ratio is 16×. However, if the final stage $V_{LOW}$ is set to $V_{NEG}$, the overall conversion ratio increases by 1× to become 17×. Similarly, setting the third stage $V_{LOW}$ to $V_{NEG}$ raises voltage $V_C$ by ~$V_{IN}$, resulting in an increase of overall conversion ratio by 2×. On the other hand, setting $V_{LOW}$ to $V_{IN}$ decreases con-version ratio. In this way the conversion ratio is controlled in a binary manner as shown in Table 1 below, generating any integer ratio from 9× to 23×. By changing the conversion ratio, harvester input voltage $V_{IN}$ can be adjusted to closely approximate the maximum-power point of the power source, thereby optimizing the power harvested from the source.

TABLE I

Switch Mapping for Harvester's Overall Conversion Ratio Control From 9x to 23x

| Ratio | 9x | 10x | 11x | 12x | 13x | 14x | 15x | 16x | 17x | 18x | 19x | 20x | 21x | 22x | 23x |
|---|---|---|---|---|---|---|---|---|---|---|---|---|---|---|---|
| Bypass | 1 | 1 | 1 | 1 | 1 | 1 | 1 | 0 | 0 | 0 | 0 | 0 | 0 | 0 | 0 |
| $V_{L2}$ | $V_{NEG}$ | $V_{NEG}$ | $V_{NEG}$ | $V_{NEG}$ | $V_{NEG}$ | $V_{NEG}$ | $V_{NEG}$ | GND | $V_{NEG}$ | $V_{NEG}$ | $V_{NEG}$ | $V_{NEG}$ | $V_{NEG}$ | $V_{NEG}$ | $V_{NEG}$ |
| $V_{L3}$ | $V_{IN}$ | $V_{IN}$ | GND | GND | GND | $V_{NEG}$ | $V_{NEG}$ | GND | $V_{IN}$ | $V_{IN}$ | GND | GND | GND | $V_{NEG}$ | $V_{NEG}$ |

TABLE I-continued

Switch Mapping for Harvester's Overall Conversion Ratio Control From 9x to 23x

| Ratio | 9x | 10x | 11x | 12x | 13x | 14x | 15x | 16x | 17x | 18x | 19x | 20x | 21x | 22x | 23x |
|---|---|---|---|---|---|---|---|---|---|---|---|---|---|---|---|
| $V_{L4}$ | $V_{IN}$ | GND | $V_{IN}$ | GND | $V_{NEG}$ | GND | $V_{NEG}$ | GND | $V_{IN}$ | GND | $V_{IN}$ | GND | $V_{NEG}$ | GND | $V_{NEG}$ |
| $V_A$ | 1x | 1x | 1x | 1x | 1x | 1x | 1x | 2x | 2x | 2x | 2x | 2x | 2x | 2x | 2x |
| $V_B$ | 3x | 3x | 3x | 3x | 3x | 3x | 3x | 4x | 5x | 5x | 5x | 5x | 5x | 5x | 5x |
| $V_C$ | 5x | 5x | 6x | 6x | 6x | 7x | 7x | 8x | 9x | 9x | 10x | 10x | 10x | 11x | 11x |
| $V_{OUT}$ | 9x | 10x | 11x | 12x | 13x | 14x | 15x | 16x | 17x | 18x | 19x | 20x | 21x | 22x | 23x |

By selecting the bottom voltage from among three choices rather than just two, the overall conversion ratio range is greater and also the voltage across each doubler can be chosen properly for best operation. For example, the switch mapping shown in Table I first seeks to develop a larger voltage across the second doubler since its use of standard $V_{TH}$ transistors, coupled with its lower amplitude (relative to later stages) make its operation more challenging.

Figure 14:
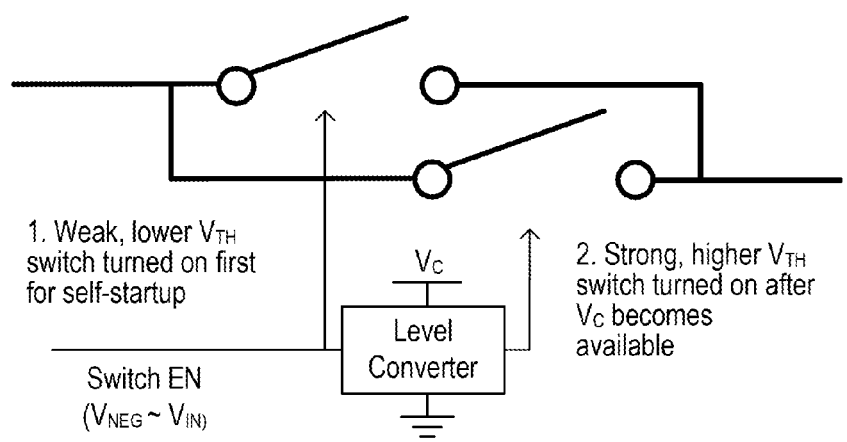
FIG. 14 is a diagram of an example dual switching scheme for the harvester to reconfigure its conversion ratio while maintaining its capability of self-startup.

To enable cold start of the complete system, the control logic (including the conversion ratio register) operates between $V_{NEG}$ and $V_{IN}$ rails. Upon initial system startup, $V_{NEG}$ and $V_{2x}$ become available first, thus allowing the control logic to turn on and configure the switches. As shown in FIG. 14, every switch is realized with a dual structure, one controlled with lower voltages for harvester self-startup, and the other controlled by a level-converted higher voltage to strongly turn on the switch for high output power levels. As each stage is powered up, its internal frequency modulation begins to control the frequency for optimum efficiency.

Figure 15A:
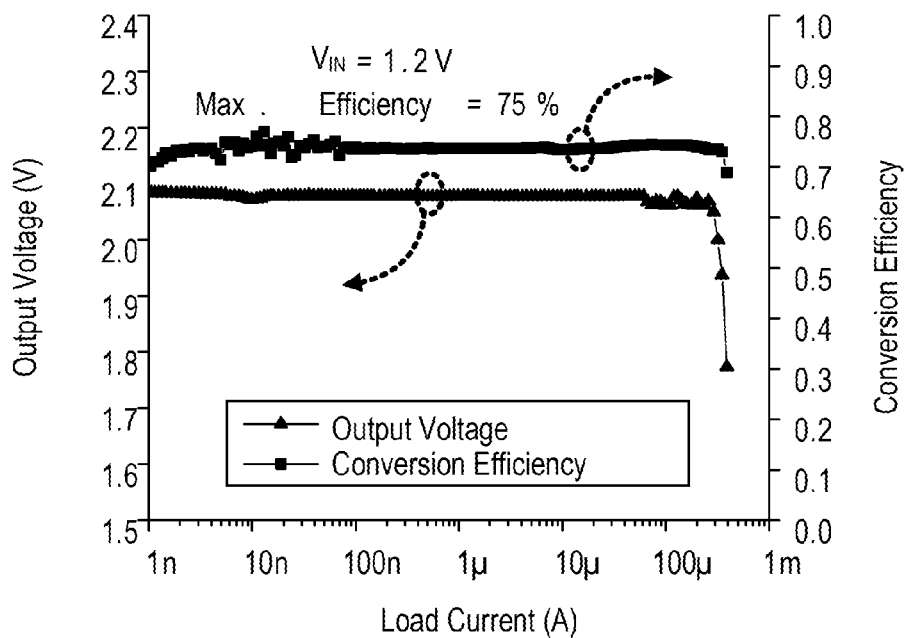
FIGS. 15A and 15B are graphs depicting measured result of the voltage doubler.
Figure 15B:
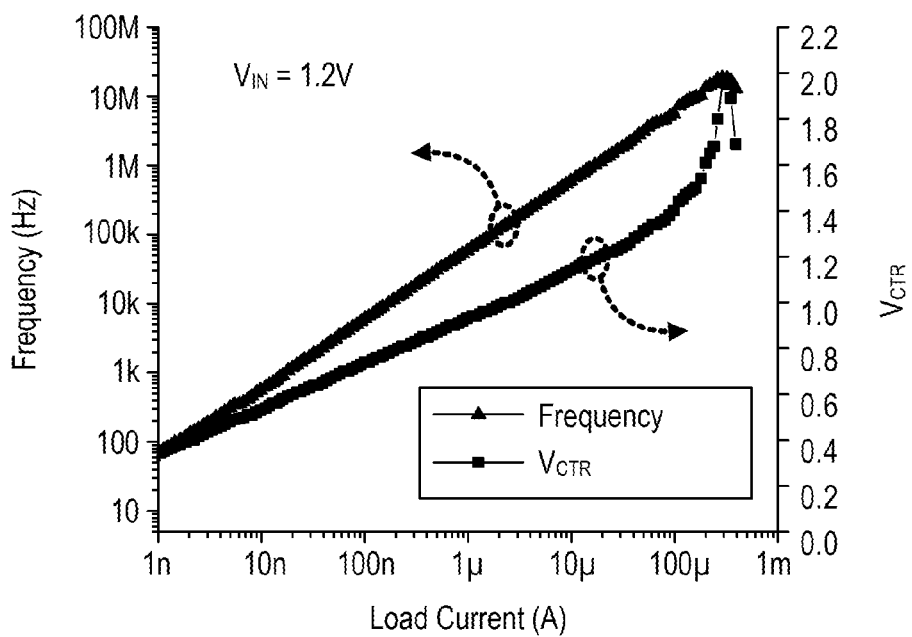

The proposed voltage doubler (standalone) and energy harvester are fabricated in 0.18 µm CMOS. The standalone voltage doubler uses bootstrapping to minimize its leakage. The division ratio of the output voltage divider in the frequency feedback control circuit (see FIG. 9), which is equivalent to the desired output to input voltage ratio ($R_{DIV\_DESIRED}$), is set to 1.73 for the standalone voltage doubler in all measurements. FIGS. 15A and 15B show a single doubler has >70% measured efficiency across 1 nA to 0.35 mA output current (>$10^5$ range) with low idle power consumption of 170 pW. Internal clock frequency is modulated to maintain constant $R_{DIV}$ and is proportional to the load current until the clock period becomes too short relative to the time constant for charging/discharging a flying cap. As described in expression (13) in Section II-B, the conversion efficiency of the doubler is nearly flat within its operational range with an efficiency of roughly $R_{DIV\_DESIRED}-1=73\%$.

Figure 16A:
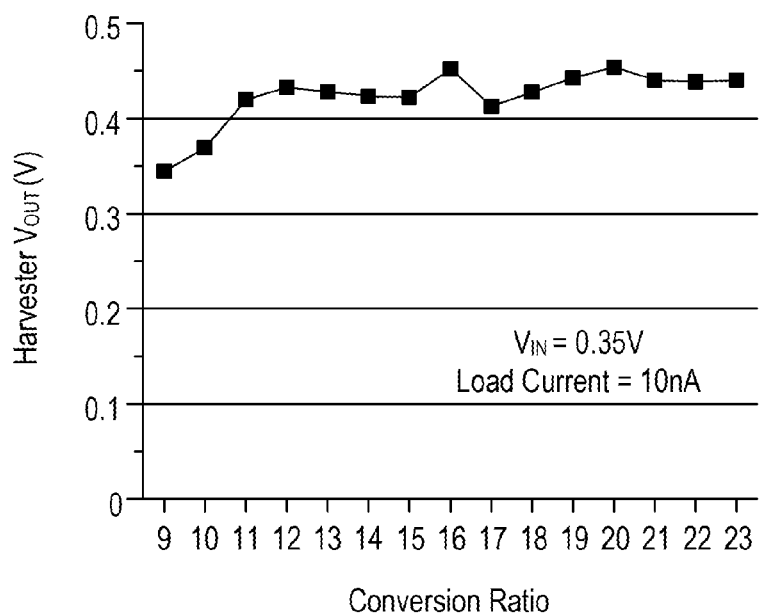
FIGS. 16A and 16B are graphs depicting measured results of the harvester with different conversion ratios.
Figure 16B:
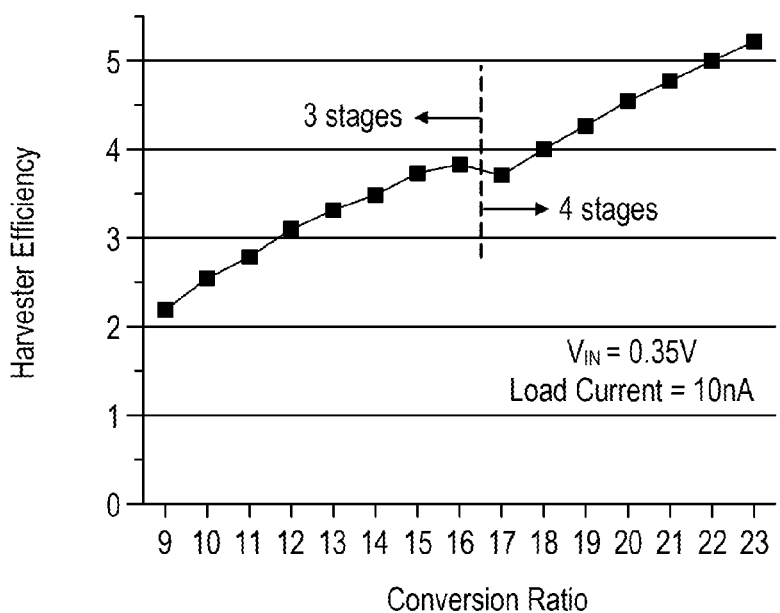
Figure 17A:
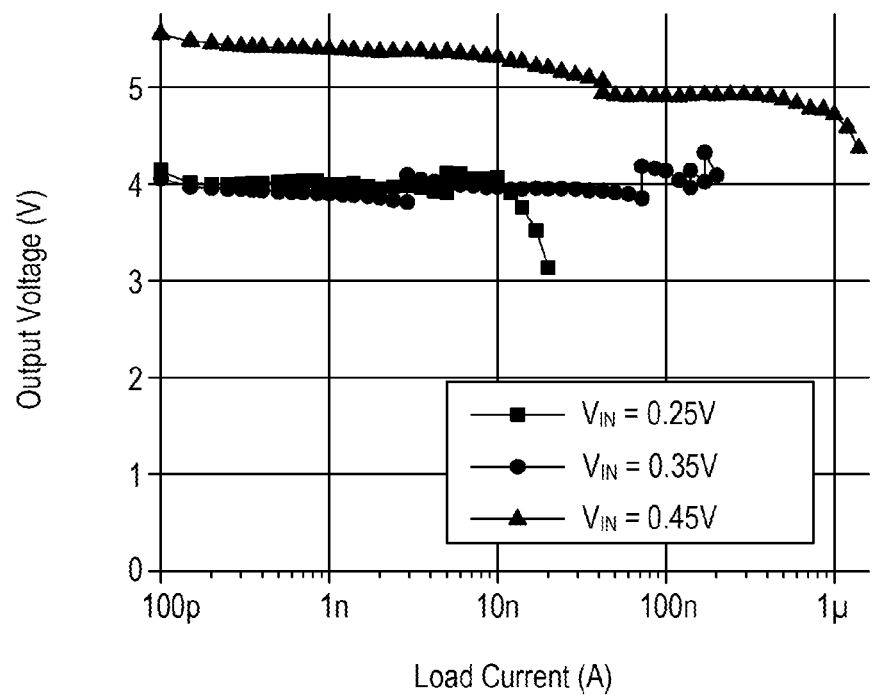
FIGS. 17A and 17B are graphs depicting measured results of the harvester at different $V_{in}$.
Figure 17B:
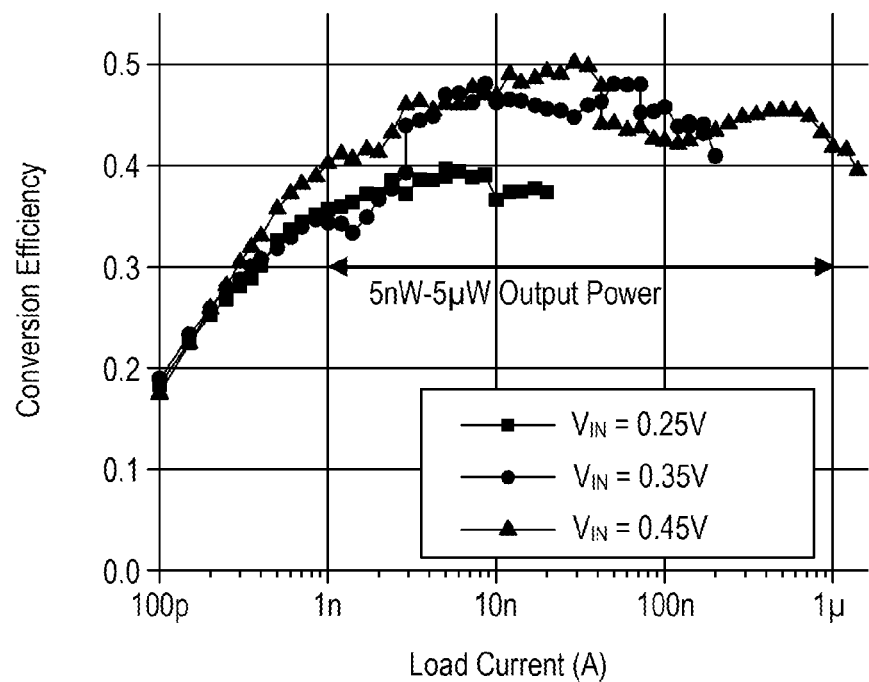

FIGS. 16A and 16B show measured results of the harvester with different conversion ratios. Results show that a 0.35 V input can be converted to a 2.2 V-5.2 V voltage range with similar conversion efficiencies across settings. As conversion ratio goes up, output voltage level monotonically increases except for a transition from 16× to 17×. At this transition, the number of cascaded stages increases from 3 to 4, thereby introducing another power loss at the first stage and lowering output voltage level. FIGS. 17A and 17B show measured results of the harvester at different $V_{IN}$. Conversion ratio is adjusted to maintain a similar $V_{OUT}$ level. With $V_{IN}$=0.45 V, corresponding to an outdoor condition, the harvester delivers 5 nW-5 µW output power with >40% efficiency and an idle power consumption <3 nW. For $V_{IN}$=0.25 V, corresponding to a solar cell under very low light, the harvester can take in between 10 nW and 120 nW to charge a ~4 V battery with >35% efficiency. For both $V_{IN}$, the harvester's output power range well covered expected solar cell power range.

Figure 18:
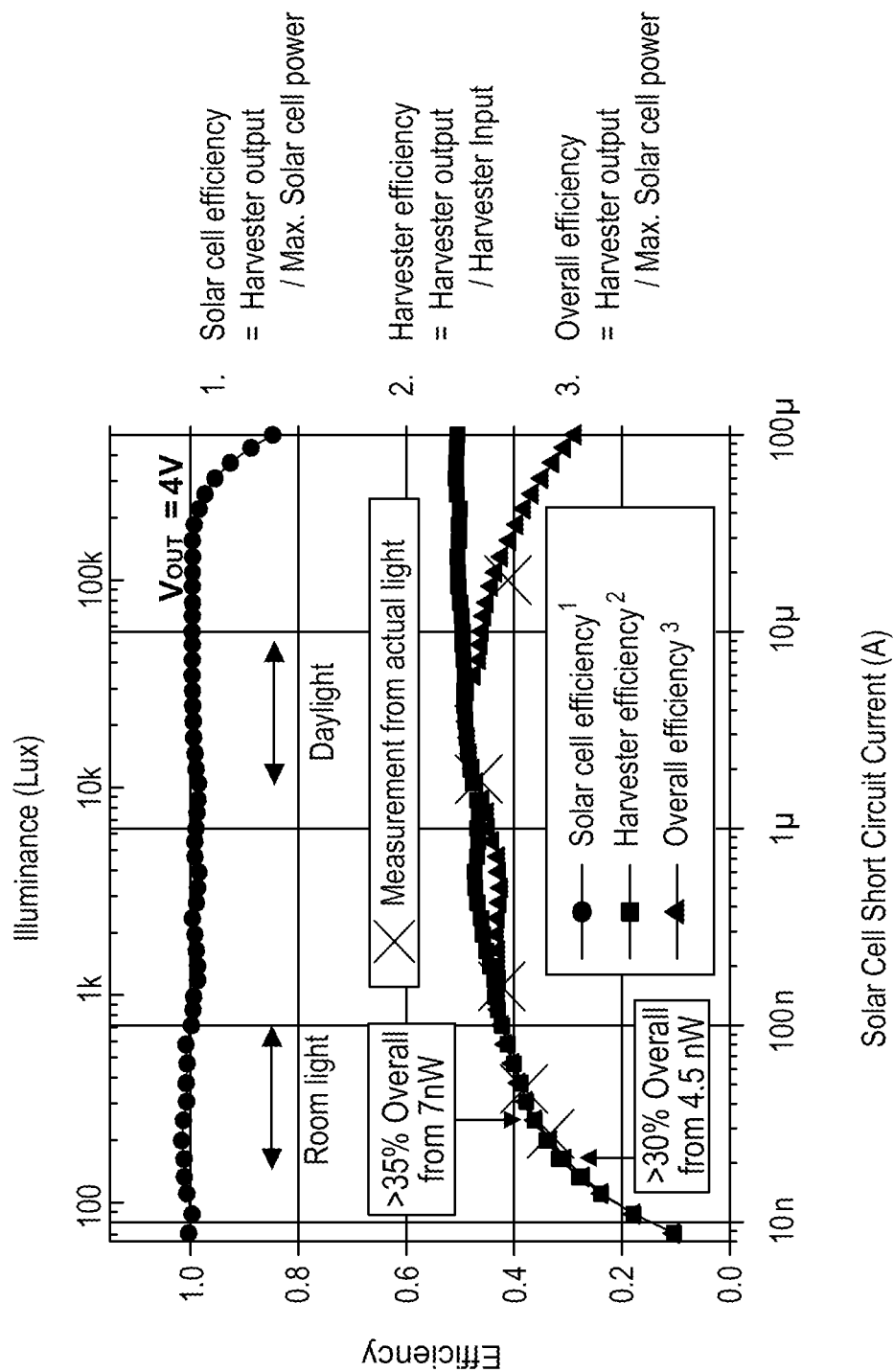
FIG. 18 is a graph showing measured results of the harvester with a 0.84 mm$^2$ silicon solar cell at the input.

FIG. 18 shows the measured results with a small silicon solar cell (0.84 mm$^2$) at the input. In one test, the harvester is connected to the solar cell under various light conditions. These results are shown in the graph as the X-marked points. In the second test, the solar cell operation is emulated using an external current source in parallel with the solar cell, to perform a finer grain sweep of harvester performance. These two test results are very consistent as shown together in this graph, showing that the harvester can convert input power from the solar cell with up to 50% efficiency under a wide range of light condition, from dim room lighting to beyond outdoor daylight. Because of its low idle power consumption, the harvester shows >35% end-to-end efficiency even under a dim light of 260 lux, where the solar cell generates only 7 nW output power. By adjusting the conversion ratio the harvester can take in nearly 100% of the solar cell output power at its maximum power point for incident light up to 200 klux, covering almost all practical light conditions (FIG. 18, "Solar cell efficiency" curve).

Figure 19:
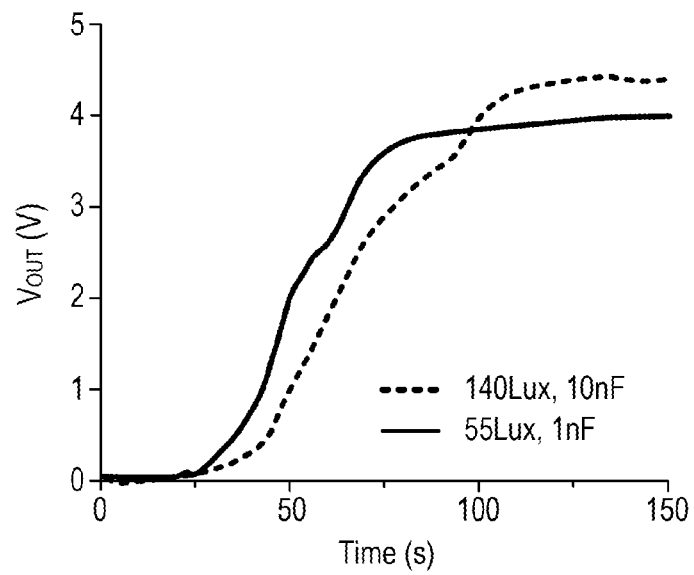
FIG. 19 is a graph showing cold start behavior of the harvester powered by a 1.22 mm$^2$ solar cell.
Figure 20:
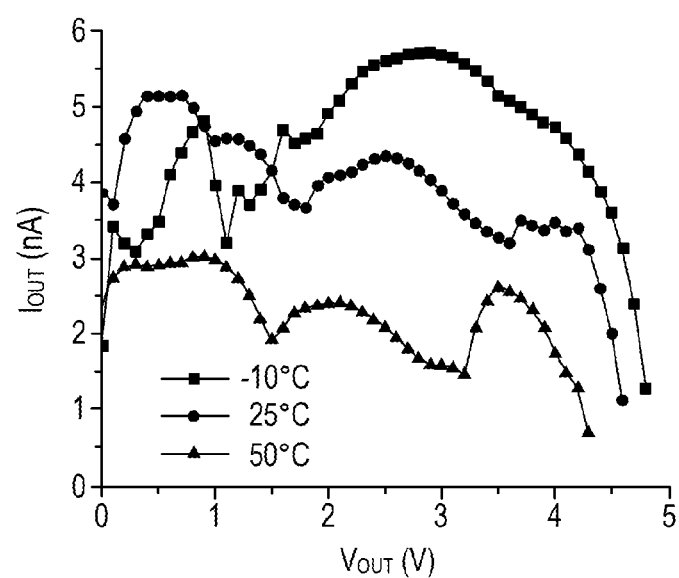
FIG. 20 shows measured results of the harvester in different temperatures, with solar cell $I_{sc}$=180 nA.

A second chip is fabricated in 0.18 µm CMOS that includes the harvester with the same design specifications previously described but has interfaces compatible with the M$^3$ (Michigan Micro-Mote) sensor system. This chip is tested with a solar cell of 1.33 mm$^2$ area to measure its self-startup characteristic. As shown in FIG. 19, the harvester cold starts with 55 lux of light and a 5.2 nW power source and charges an output capacitance to 4 V, which is a voltage enough to charge a battery. FIG. 20 shows measured results in different temperatures, with solar cell short circuit current overridden to 180 nA to emulate room lighting. The results show the harvester's robust operation across −10° C.-50° C. temperature range.

This disclosure presents an ultra-low power fully integrated energy harvester based on a novel SC voltage doubler structure. Internalized clock generation and clock frequency modulation allow the doubler to operate across a wide load range (>$10^5$×) with low idle power consumption of 170 pW. Four voltage doublers are cascaded to form an energy harvester, which can operate with a very limited power source of a few nWs. Overall harvester conversion ratio is configurable from 9× to 23× using bottom voltage switching, a negative voltage generator, and cascaded stage count, generating 2.2 V-5.2 V $V_{OUT}$ from 0.35 V $V_{IN}$. Measured results with a small silicon solar cell (1.33 mm$^2$) show the harvester cold starts with 55 lux of light and a 5.2 nW power source. The harvester chip is integrated in an actual wireless sensor node system and demonstrates charging of the system battery during typical operation.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A self-oscillating DC-DC converter, comprising:
an upper ring oscillator comprised of n upper stages, each upper stage having an input node, an output node, a supply node, and a return node, where the supply node from each upper stage is electrically coupled together, the return node from each upper stage is electrically coupled to a common return line;
a lower ring oscillator comprised of n lower stages, each lower stage having an input node, an output node, a supply node, and a return node, where the supply node from each lower stage is electrically coupled to the common return line and the return node from each lower stage is electrically coupled together; and
at least one capacitor electrically coupled between an output node of a given upper stage and an output node in a corresponding lower stage,
wherein one or more delay elements are interposed between stages of the upper and lower ring oscillators.

2. The self-oscillating DC-DC converter of claim 1 wherein each stage in the upper ring oscillator and lower ring oscillator includes an inverter circuit and n is an odd integer greater than 2.

3. The self-oscillating DC-DC converter of claim 2 wherein each inverter circuit is further defined as a static CMOS inverter.

4. The self-oscillating DC-DC converter of claim 1 wherein each stage in the upper ring oscillator and lower ring oscillator includes one or more logic gates configured to perform an inverting function.

5. The self-oscillating DC-DC converter of claim 1 further comprises n capacitors electrically coupled between the upper ring oscillator and the lower ring oscillator, such that one capacitor is electrically connected between each output node of the upper stage and an output node of the corresponding lower stage.

6. The self-oscillating DC-DC converter of claim 1 wherein the supply nodes from the upper ring oscillator are coupled to a terminal configured to receive a first input voltage, the supply nodes from the lower ring oscillator are coupled to a terminal configured to receive a second input voltage and the return nodes from the lower ring oscillator are coupled to a terminal configured to receive a third input voltage, where the second input voltage is larger than the third input voltage and the first input voltage is larger than the second input voltage.

7. The self-oscillating DC-DC converter of claim 1 wherein the supply nodes from the lower ring oscillator are coupled to one input terminal for the lower ring oscillator and the return nodes from the lower ring oscillator are coupled to another input terminal for the lower ring oscillator such that the pair of input terminals are configured to receive an input voltage for driving the lower ring oscillator; and the supply nodes from the upper ring oscillator are coupled to one output terminal for the converter and the return nodes from the lower ring oscillator are coupled to another output terminal for the converter such that the input voltage is upconverted to an output voltage measured across the pair of output terminals.

8. The self-oscillating DC-DC converter of claim 1 wherein the supply nodes from the upper ring oscillator are coupled to one input terminal for the converter and the return node from the lower ring oscillator are coupled to another input terminal for the converter such that the pair of input terminals are configured to receive an input voltage; and the supply nodes from the lower ring oscillator are coupled to one output terminal for the lower ring oscillator and the return nodes from the lower ring oscillator are coupled to another output terminal for the lower ring oscillator such the input voltage is downconverted to an output voltage measured across the pair of output terminals.

9. A self-oscillating DC-DC converter, comprising:
an upper oscillator comprised of n upper stages arranged in series, each upper stage having an input node, an output node, a supply node, and a return node, where the supply node from each upper stage is electrically coupled together, the return node from each upper stage is electrically coupled to a common return line, n is an odd integer greater than 2, and the output node of one stage is connected to the input node of the adjacent stage with the exception of the output node of the last stage which is connected to the input node of the first stage;
a lower oscillator comprised of n lower stages arranged in series, each lower stage having an input node, an output node, a supply node, and a return node, where the supply node from each lower stage is electrically coupled to the common return line and the return node from each lower stage is electrically coupled together, the output node of one stage is connected to the input node of the adjacent stage with the exception of the output node of the last stage which is connected to the input node of the first stage; and
n capacitors electrically coupled between the upper ring oscillator and the lower ring oscillator, such that one capacitor is electrically connected between each output node of the upper stage and an output node of the corresponding lower stage,
wherein one or more delay elements are interposed between stages of the upper and lower ring oscillators.

10. The self-oscillating DC-DC converter of claim 9 wherein each stage is implemented by an inverter circuit.

11. The self-oscillating DC-DC converter of claim 10 wherein each inverter circuit is further defined as a static CMOS inverter.

12. The self-oscillating DC-DC converter of claim 10 wherein each stage further includes a delay cell coupled to the inverter circuit.

13. The self-oscillating DC-DC converter of claim 9 wherein each stage includes one or more logic gates configured to perform an inverting function.

14. The self-oscillating DC-DC converter of claim 9 wherein the supply nodes from the upper oscillator are coupled to a terminal configured to receive a first input voltage, the supply nodes from the lower oscillator are coupled to a terminal configured to receive a second input voltage and the return nodes from the lower oscillator are coupled to a terminal configured to receive a third input voltage, where the second input voltage is larger than the third input voltage and the first input voltage is larger than the second input voltage.

15. The self-oscillating DC-DC converter of claim 9 wherein the supply nodes from the lower oscillator are coupled to one input terminal for the lower oscillator and the return nodes from the lower oscillator are coupled to another input terminal for the lower oscillator such that the pair of input terminals are configured to receive an input voltage for driving the lower oscillator; and the supply nodes from the upper oscillator are coupled to one output terminal for the converter and the return nodes from the lower oscillator are coupled to another output terminal for the converter such that the input voltage is upconverted to an output voltage measured across the pair of output terminals.

16. The self-oscillating DC-DC converter of claim 9 wherein the supply nodes from the upper oscillator are coupled to one input terminal for the converter and the return node from the lower oscillator are coupled to another input terminal for the converter such that the pair of input terminals are configured to receive an input voltage; and the supply nodes from the lower oscillator are coupled to one output terminal for the lower oscillator and the return nodes from the lower ring oscillator are coupled to another output terminal for the lower oscillator such the input voltage is downconverted to an output voltage measured across the pair of output terminals.

17. A self-oscillating DC-DC converter, comprising:
an upper ring oscillator comprised of n upper stages arranged in series, each upper stage having an input node, an output node, a supply node, and a return node, where the supply node from each upper stage is electrically coupled together and form a first input terminal, the return node from each upper stage is electrically coupled together and form a second input terminal;
a lower ring oscillator comprised of n lower stages arranged in series, each lower stage having an input node, an output node, a supply node, and a return node, where the supply node from each lower stage is electrically coupled together and form a third input terminal, the return node from each lower stage is electrically coupled together and form a fourth input terminal; and
at least one capacitor electrically coupled between an output node of a given upper stage and an output node in a corresponding lower stage, wherein each stage further includes a delay cell coupled to the inverter circuit.

18. The self-oscillating DC-DC converter of claim 17 wherein each stage is implemented by an inverter circuit.

19. The self-oscillating DC-DC converter of claim 18 wherein each inverter circuit is further defined as a static CMOS inverter.

20. The self-oscillating DC-DC converter of claim 17 wherein each stage includes one or more logic gates configured to perform an inverting function.

21. A self-oscillating DC-DC converter, comprising:
an upper ring oscillator comprised of n upper stages arranged in series, each upper stage having an input node, an output node, a supply node, and a return node, where the supply node from each upper stage is electrically coupled together and form a first input terminal, the return node from each upper stage is electrically coupled together and form a second input terminal, n is an odd integer greater than 2, and the output node of one stage is connected to the input node of the adjacent stage with the exception of the output node of the last stage which is connected to the input node of the first stage;
a lower ring oscillator comprised of n lower stages arranged in series, each lower stage having an input node, an output node, a supply node, and a return node, where the supply node from each lower stage is electrically coupled together and form a third input terminal, the return node from each lower stage is electrically coupled together and form a fourth input terminal, the output node of one stage is connected to the input node of the adjacent stage with the exception of the output node of the last stage which is connected to the input node of the first stage; and
n capacitors electrically coupled between the upper ring oscillator and the lower ring oscillator, such that one capacitor is electrically connected between each output node of the upper stage and an output node of the corresponding lower stage,
wherein one or more delay elements are interposed between stages of the upper and lower ring oscillators.

* * * * *